United States Patent [19]

Arakawa

[11] Patent Number: 5,459,694
[45] Date of Patent: Oct. 17, 1995

[54] NONVOLATILE STORAGE APPARATUS WITH FOLDED BIT LINE STRUCTURE

[75] Inventor: Hideki Arakawa, Kanagawa, Japan

[73] Assignee: Sony Corporation, Tokyo, Japan

[21] Appl. No.: 219,542

[22] Filed: Mar. 29, 1994

[30] Foreign Application Priority Data

Mar. 31, 1993 [JP] Japan ................... 5-097306

[51] Int. Cl.$^6$ .................................. G11C 7/00
[52] U.S. Cl. ..................... 365/210; 365/203; 365/205; 365/190; 365/185.12
[58] Field of Search ................... 365/210, 185, 365/205, 207, 208, 190, 203

[56] References Cited

U.S. PATENT DOCUMENTS 5,022,009  6/1991  Terada ................. 365/210
5,043,942  8/1991  Iwata ................... 365/185
5,184,324  2/1993  Ohta .................. 365/203 X Primary Examiner—David C. Nelms
Assistant Examiner—Son Mai
Attorney, Agent, or Firm—Hill, Steadman & Simpson

[57] ABSTRACT

A semiconductor nonvolatile memory device which can adopt a folded bit line system and can achieve an enhancement of speed of the read out time etc., which device adopting a differential type sensing system comprising a bit line BL and an inverted bit line BL_ connected in parallel to a sense amplifier SA$_f$, wherein provision is made of a first memory cell MC1 connected to a word line WL and the bit line BL; a second memory cell MC2 connected to the word line WL which is common also for the first memory cell MC1, and, connected to the inverted bit line BL_; and a circuit BVA which retains the potential of either one of bit lines of the bit line BL and the inverted bit line BL_ at the first potential at the time of a read out operation, and, sets the potential of the other bit line at the second potential made to have a difference from the first potential for a predetermined time.

7 Claims, 6 Drawing Sheets

NONVOLATILE STORAGE APPARATUS WITH FOLDED BIT LINE STRUCTURE

BACKGROUND OF THE INVENTION

1. Field of the Invention

The present invention relates to a semiconductor memory device, more particularly, a nonvolatile memory which can be electrically rewritten, for example, a semiconductor nonvolatile memory device such as a flash EEPROM.

2. Description of the Related Art

As a symmetrical arrangement of a bit line and an inverted bit line having a complementary level to this in a semiconductor memory device, for example, a dynamic random access memory (DRAM) circuit, there is a so-called differential type sensing circuit (including flip-flop type), wherein, to produce a reference level for a differential sense amplifier, a reference cell referred to as a dummy cell corresponding to a storage cell is arranged in the inverted bit line on the opposite side to the side for reading data.

Conventionally, it has been impossible for a flash EEPROM, particularly a NAND type, to adopt the so-called folded bit line method which is advantageous for the enhancement of speed etc. and has been adopted in a DRAM circuit etc.

Therefore, as shown in FIG. 1, there has been adopted an open bit line system (refer to for example Document 1: "A Quick Intelligent Program Architecture for 3V-only NAND EEPROMS"; Sympo. VLSI Cir. pp 20–21. 1992) in which data lines DLR and DLL which become symmetrical lines around a sense amplifier (SA) 1 are separated in terms of position, and memory cell arrays (MCAR) 11 and (MCAL) 6 are connected as the storage cells and dummy cells (DCLR) 14 and (DCLL) 2 to the respective data lines (DR) 2 and (DL) 15.

In the above-mentioned open bit line system, however, even though lines are in a symmetrical arrangement, they are separated in terms of position, and therefore there is liable to be an imbalance in the electrical characteristics between the symmetrical lines. Further, it is not possible to completely equalize the noise voltage resulting from connection from another conductive body such as a peripheral circuit to the symmetrical lines. Therefore, the influence of the noise is larger than that of the folded bit line system and it is difficult to achieve an enhancement of sensitivity of the sense amplifier, resulting in a problem that the enhancement of speed was difficult.

As a result, a NAND type cell has been considered as a low speed and large capacity memory, and the random access time becomes about 1 μs.

Also, as shown in FIG. 2, to construct the folded bit line system, a divided bit line system having a divided bit line structure (document 2: "High Speed Page Mode Sensing Scheme for EPROM's and Flash EEPROM's using Divided Bit Line Architecture"; SympoVLSI Cir. pp 97–98, 1990) has been proposed.

Note that, in FIG. 2, SA denotes a sense amplifier 44; SRG denotes a storage cell 35; DCL denotes a dummy cell 25; WL denotes a word line 33; DWL denotes a dummy word line 23; BL denotes a bit line 21; BL__ denotes an inverted bit line 22; $nt_1$ to $nt_4$ denote n-channel MOS transistors 30, 27, 39, 41; and $C_B$ denotes a capacitor 26, 29, 37, 38; respectively. The folded bit line system is realized by dividing the bit line by turning on and off the transistors ($nt_1$ to $nt_4$) 30, 32, 39, 41 by the signals (SW1) 31 and (SW2) 40.

In this divided bit line system, however, due to the necessity of sensing by connecting the divided bit line, the potential difference between the bit line BL and inverted bit line BL__ which were especially provided is reduced to a half potential difference. This disadvantage will be explained in further detail below referring to FIG. 2.

Now assume that the signals (SW1) 31 and (SW2) 40 are at the low level, the transistors ($nt_1$ to $nt_4$) 30, 27, 39, are in the OFF state, the storage cell (SRG) 35 and dummy cell (EMIL) 25 pass a current, and the potentials of the bit line (BL) 21 or the inverted bit line (BL__) 22 become as follows:

VBL1=0 V
VBL2=VPC—ΔVBL2
VBL1=VPC—ΔVBL1
VBL2=0V where, VPC indicates a precharge level.

Here, when assuming that the signal (SW1) 31 is made the high level and the transistors ($nt_1$ and $nt_3$) 30 and 39 are brought to the ON state, the following formulas stand:

$$\text{VBL}=(\tfrac{1}{2})\,(\text{VBL1}+\text{VBL2})=(\tfrac{1}{2})\,(\text{VPC}-\Delta\text{VBL2}) \tag{1}$$

$$\text{VBL\_}=(\tfrac{1}{2})\,(\text{VBL1\_}+\text{VBL2\_})=(\tfrac{1}{2})\,(\text{VPC}-\Delta\text{VBL1\_}) \tag{2}$$

Accordingly, it becomes:

$$\Delta\text{VBL}-\text{BL\_}=\text{VBL}-\text{VBL\_}=(\tfrac{1}{2})\,(\Delta\text{VBL1\_}-\Delta\text{VBL2}) \tag{3}$$

In this way, it becomes the potential difference of ½.

SUMMARY OF THE INVENTION

An object of the present invention is to provide a nonvolatile storage apparatus, such as a semiconductor nonvolatile memory device, which can be made by a folded bit line structure.

Another object of the present invention is to provide a nonvolatile storage apparatus which can improve an operation speed, such as a speed of the read-out time.

According to the present invention, there is provided a semiconductor nonvolatile memory device which adopts a differential type sensing system comprising first and second bit lines connected in parallel with respect to a sense amplifier, having a first memory cell which is connected to a word line and a first bit line; a second memory cell which is connected to a word line common also for the first memory cell and connected to the second bit line; and a means which holds the potential of either bit line of the first and second bit lines at the first potential at the time of a predetermined operation and, at the same time, sets the potential of the other bit line at a second potential made to have a difference from the first potential for a predetermined time.

In the present invention, further, provision is made of a semiconductor nonvolatile memory device which adopts a differential type sensing system comprising first and second bit lines connected in parallel with respect to a sense amplifier, having a plurality of memory cell blocks connected to the first and second bit lines and being provided between the respective memory cell blocks and bit lines with a selective gate at which two selective transistors are connected in cascade to selectively connect a related memory cell block and bit line.

Preferably, one of the above-described two selective transistors at the selective gate may be constituted by a depletion type transistor.

Specifically, the above-described memory cell may be a NOR type or, a NAND type.

According to the present invention, the first and second bit lines are held at the same potential at the time of for example a precharge, but where the read out operation is carried out from for example the first memory cell, the second bit line is held at the first potential, and the first bit line is set at a second potential which is higher than for example the first potential for a predetermined time. Then, after an elapse of a predetermined time, the data is read by the sense amplifier.

According to the present invention, in a structure having a plurality of memory cell blocks connected to the first and second bit lines, the state of connection of the respective blocks and bit lines is controlled by the selective gate comprising the two selective transistors connected in cascade.

BRIEF DESCRIPTION OF THE DRAWINGS

The above objects and features and other objects and features of the present invention will be more apparent from the following the description with reference to the accompanying drawings, in which.

DESCRIPTION OF THE PREFERRED EMBODIMENTS

Figure 1:
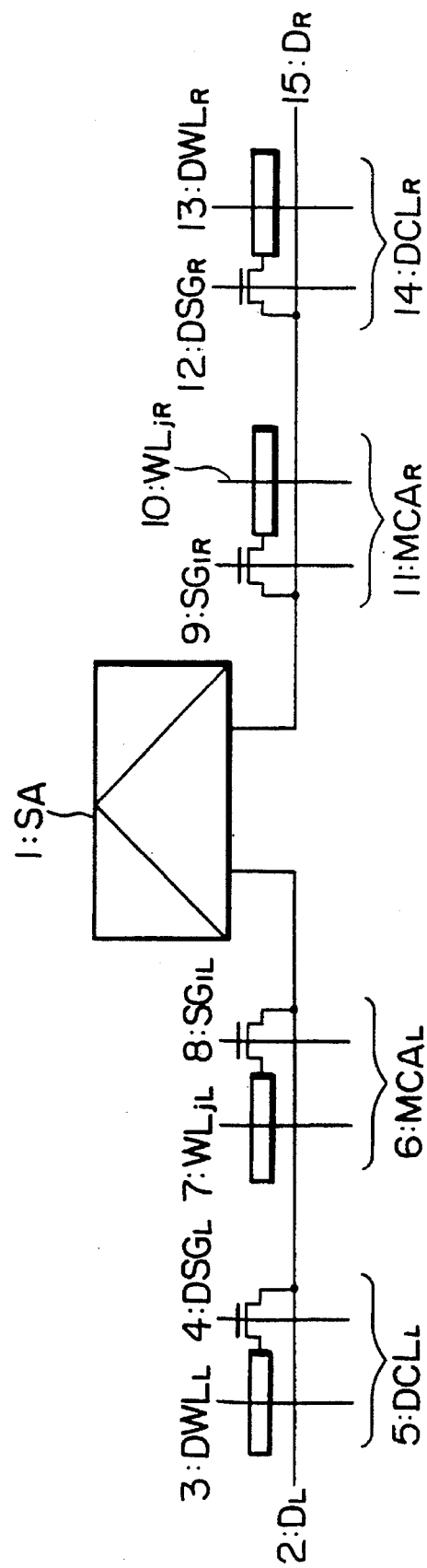
FIG. 1 is a circuit diagram showing an example of an open bit line system.
Figure 2:
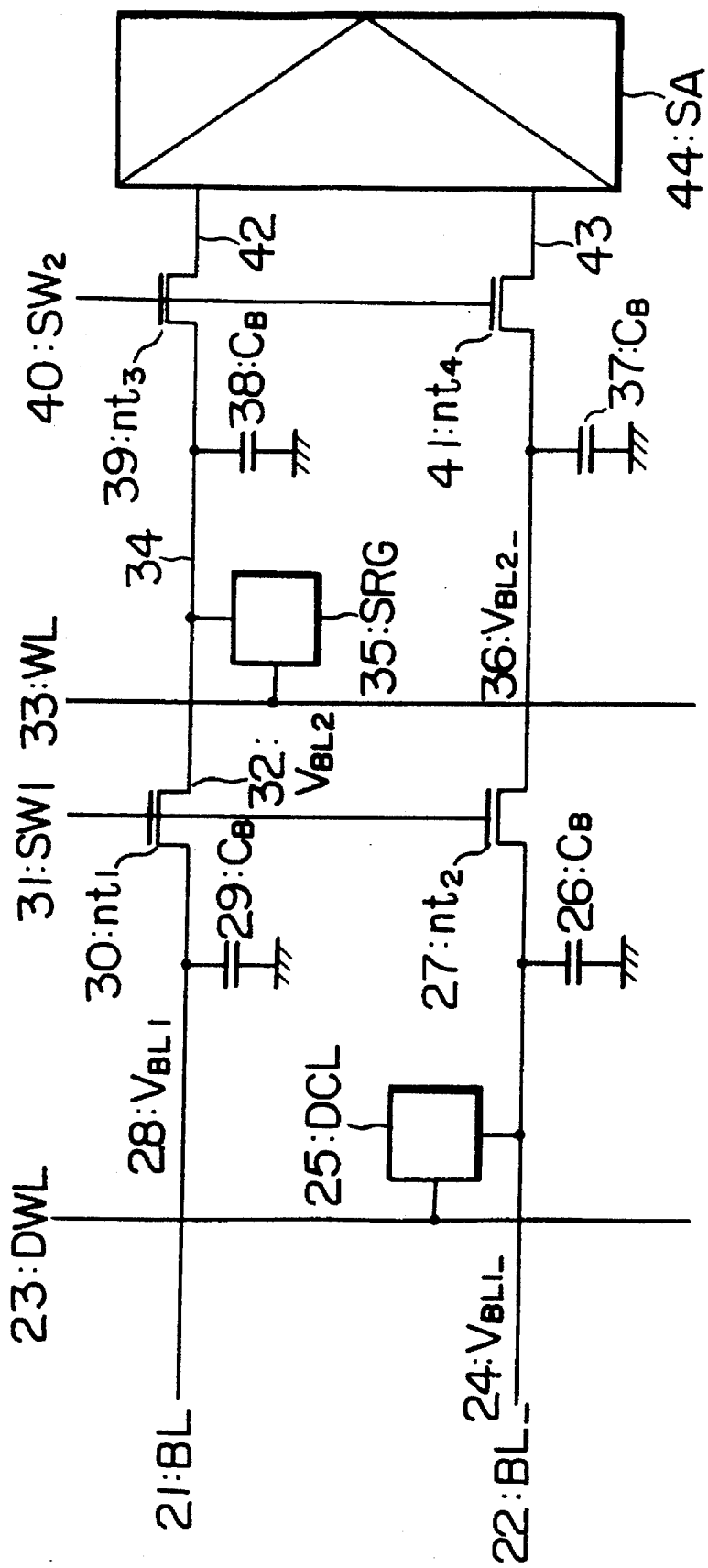
FIG. 2 is a circuit diagram showing an example of a divided bit line system.
Figure 3:
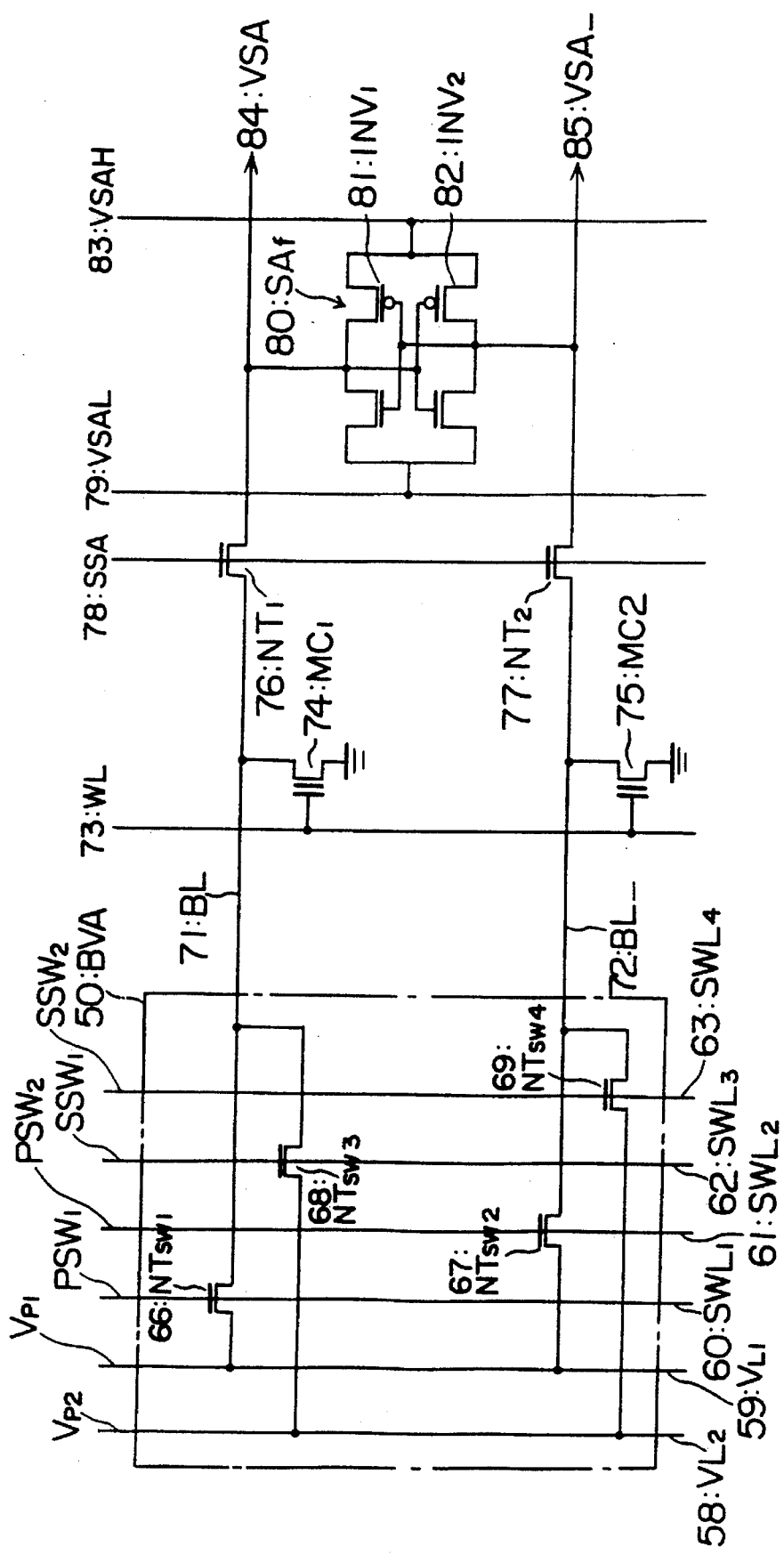
FIG. 3 is a circuit diagram showing a first embodiment of a semiconductor nonvolatile memory device according to the present invention.

FIG. 3 is a circuit diagram showing a first embodiment of a semiconductor nonvolatile memory device according to the present invention.

In FIG. 3, SAf denotes a sense amplifier 80; MC1 and MC2 denote floating gate type memory cells 74 and 75; BL denotes a bit line 71; BL_ denotes an inverted bit line 72; NT1 and NT2 denote n-channel MOS transistors 76 and 77 (hereinafter referred to as nMOS transistors); and BVA denotes a bit line voltage adjustment circuit 50; respectively.

The sense amplifier (SAf) 80 is constituted by a flip-flop type sense amplifier which performs the cross connection of the input and output of the two CMOS inverters (INV1) 81 and (INV2) 82.

The output node of the inverter (INV1) 81 is connected to the bit line (BL) 71, and the output node of the inverter INV2 is connected to the inverted bit line BL_ 72.

In the memory cell (MC1) 74, the control gate thereof is connected to the word line (WL) 73, the source is grounded, and the drain is connected to the bit line (BL) 71.

In the memory cell (MC2) 75, the control gate thereof is connected to the word line (WL) 73, the source is grounded, and the drain is connected to the opposite bit line (BL_) 72.

The nMOS transistor (NT1) 76 is inserted and connected to between the point of connection of the drain of the memory cell (MC1) 74 and the bit line (BL) 71 and the point of connection of the output node of the CMOS inverter (INV1) 81 of the sense amplifier (SAf) 80 and the bit line (BL) 71, and the gate is connected to the input line of the SSA 78 signal.

The nMOS transistor (NT2) 77 is inserted and connected to between the point of connection of the drain of the memory cell (MC2) 75 and the inverted bit line (BL_) 72 and the point of connection of the output node of the CMOS inverter (INV2) 82 of the sense amplifier (SAf) 80 and the inverted bit line (BL_) 72, and the gate is connected to the input line of the SSA 78 signal.

The bit line voltage adjustment circuit (BVA) 50 is constituted by nMOS transistors ($NT_{SW1}$ to $NT_{SW4}$) 66 to 69; a first voltage supply line ($V_{L1}$) 59 which is the supply line of the first voltage $V_{P1}$ from the not illustrated power source; a second voltage supply line ($V_{L2}$) 58 which is the supply line of the second voltage $V_{P2}$ from the not illustrated power source; and first to fourth switch signal supply lines ($SW_{L1}$ to $SW_{L4}$) 60 to 63 which are the supply lines of the first to fourth switch signals $PSW_1$, $PSW_2$, $SSW_1$, and $SSW_2$ controlled in their levels by a not illustrated control system.

The nMOS transistor ($NT_{SW1}$) 66 is connected at its source to the first voltage supply line ($V_{L1}$) 59, connected at its drain to the bit line (BL) 71, and connected at its gate to the first switch signal supply line ($SWL_1$) 60.

The nMOS transistor ($NT_{SW2}$) 67 is connected at its source to the first voltage supply line ($V_{L1}$) 59, connected at its drain to the inverted bit line (BL_) 72, and connected at its gate to the second switch signal supply line ($SW_{L2}$) 61.

The nMOS transistor ($NT_{SW3}$) 68 is connected at its source to the second voltage supply line ($VL_2$) 58, connected at its drain to the side of point of connection between the bit line (BL) 71 and the nMOS transistor ($NT_{SW1}$) 66, and connected at its gate to the third switch signal supply line ($SWL_3$) 62.

The nMOS transistor ($NT_{SW4}$) 69 is connected at its source to the second voltage supply line ($V_{L2}$) 58, connected at its drain to the side of point of connection between the inverted bit line (BL_) 72 and the nMOS transistor ($NT_{SW2}$) 67, and connected at its gate to the fourth switch signal supply line ($SW_{L4}$) 63.

The first voltage $V_{P1}$ supplied to the first voltage supply line ($V_{L1}$) 59 and the second voltage $V_{P2}$ supplied to the second voltage supply line ($V_{L2}$) 58 satisfy the following relationship where the power source voltage is $V_{cc}$:

$$VP2 < VP1 = (V_{cc}/2) \qquad (4)$$

Figure 4:
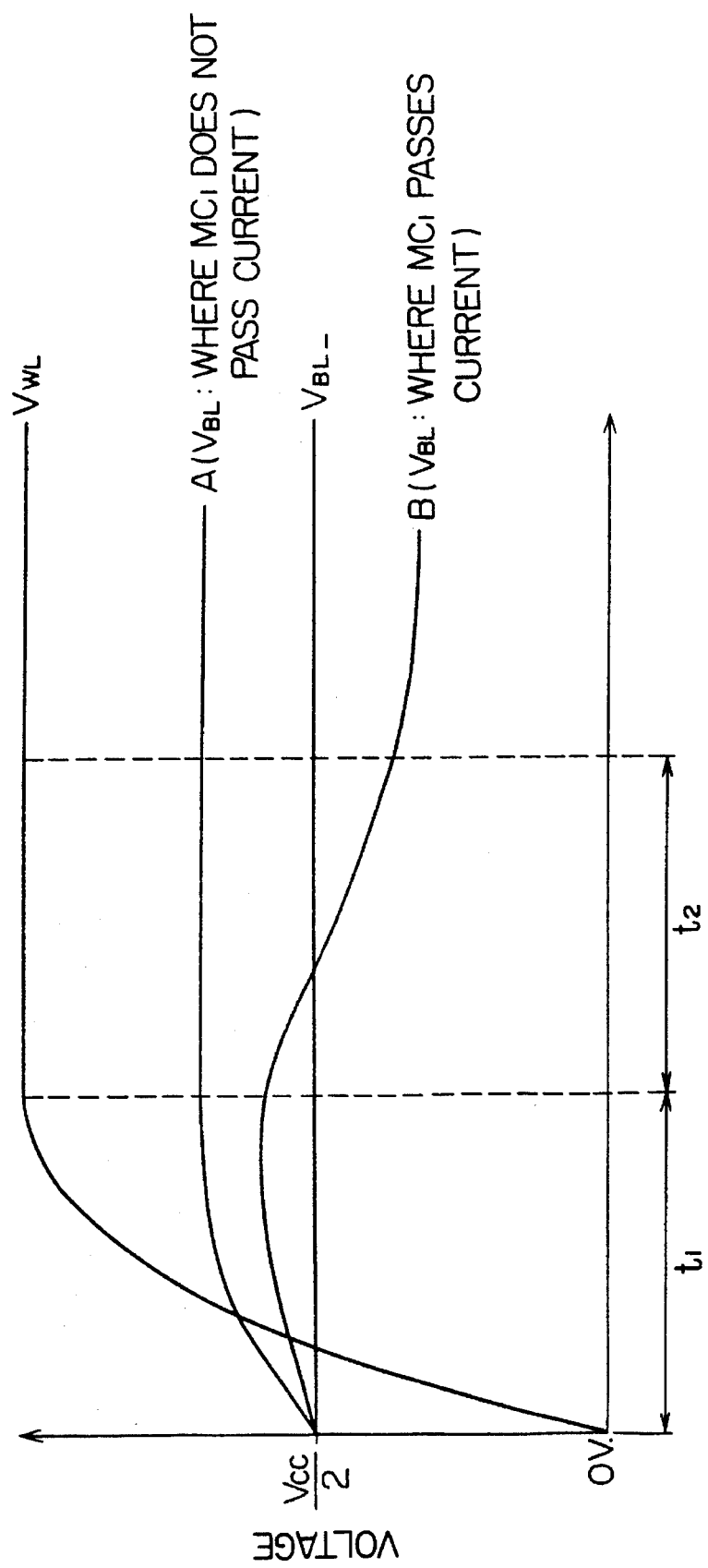
FIG. 4 is a view showing the potential change of the bit line voltage based on the adjustment of the bit line voltage adjustment circuit at the time of a read out operation.

Also, FIG. 4 is a view showing the change of potential of the bit line voltage $V_{BL}$ based on the adjustment of the bit line voltage adjustment circuit (BVA) 50 at the time of the read out operation.

In FIG. 4, an abscissa expresses the time, and an ordinate expresses the voltage, respectively. In the figure, the curve indicated by A denotes a bit line voltage $V_{BL}$ where the memory cell (MC1) 74 does not pass the current; and the curve indicated by B denotes a bit line voltage $V_{BL}$ where the memory cell (MC1) 74 passes the current.

As shown in FIG. 4, at the time of the read out operation, the bit line (BL) 71 (or the inverted bit line (BL_) 72 to which the memory cell performing the read out operation is connected is charged by the bit line voltage adjustment circuit (BVA) 50 to the second voltage $V_{P2}$ which is higher than the power source voltage $V_{cc}$ for only the predetermined time $t_1$ which is a period in which the bit line BL is charged to the voltage $V_{P2}$, and the inverted bit line (BL__) 72 (or the bit line (BL) 71) is charged to the first voltage $V_{P1}$ at the (½) $V_{cc}$ level.

A time $t_2$ indicates a period in which the bit line BL is discharged by the memory cell $MC_1$.

An explanation will be made next of the operation by the above-described structure while taking as an example a case where the data of the memory cell (MC1) 74 is read out. Note that, an explanation for the writing/erasing operation is omitted here.

First, before the read out operation, the respective signal levels are set as follows and retained in a stand-by state.

Namely, by the not illustrated control system, the first and second switch signals $PSW_1$ and $PSW_2$ are set to a high level, and the third and fourth switch signals $SSW_1$ and $SSW_2$ are set to a low level. Moreover also the levels of word line (WL) 73 and signal SSA are set at a low level.

As a result, the nMOS transistors ($NT_{SW1}$) 66 and ($NT_{SW2}$) 67 in the bit line voltage adjustment circuit (BVA) 50 become the ON state, and the nMOS transistors ($NT_{SW3}$) 68 and ($NT_{SW4}$) 69 and nMOS transistors ($NT_1$) 76 and ($NT_2$) 71 become the OFF state.

By this, a first voltage $V_{P1}$ is supplied to the bit line (BL) 71 and inverted bit line (BL__) 72, and the potential is retained at the ($V_{cc}/2$) level.

Also, $$VSA=VSA\_=VSAL=VSAH=(V_{cc}/2) \qquad (5)$$

stands.

Where the read out operation is started from the above stand-by state, the first switch signal $PSW_1$ is set at the low level and the third switch signal $SSW_1$ is set at the high level. By this, the nMOS transistor ($NT_{SW1}$) 66 becomes the OFF state, and the nMOS transistor ($NT_{SW3}$) 68 becomes the ON state.

As a result, the supply of the first voltage $V_{P1}$ to the bit line (BL) 71 is stopped, and the supply of the second voltage $V_{P2}$ is started.

Namely, the charging of the voltage $V_{BL}$ of the bit line (BL) 71 to the voltage $V_{P2}$ is started. At this time, the supply of the first voltage $V_{P1}$ is continued to the inverted bit line (BL__) 72, and the potential is retained at the ($V_{cc}/2$) level. Usually, $V_{P2}=V_{P1}-0.2$ to $0.5V$.

Next, the word line (WL) 73 is set at the high level.

Subsequently, after an elapse of a predetermined time, for example, 5 to 20 ns, from when the word line (WL) 73 is set at the high level, the third switch signal $SSW_1$ is set at the low level. By this, the nMOS transistor ($NT_{SW3}$) 68 becomes the OFF state, and the supply of the second voltage $V_{P2}$ to the bit line (BL) 71 is stopped.

If the memory cell (MC1) 74 passes a current in this state for a predetermined time, for example, 5 to 20 ns, for the time for which $V_{BL}<V_{P1}$ stands, it enters a waiting state.

After the elapse of this time, where the memory cell (MC1) 74 passes a current, $V_{BL}<V_{P1}$ stands, while where it does not pass a current, $V_{BL}=V_{P2}$ stands.

On the other hand, the voltage $V_{BL\_}$ of the inverted bit line (BL__) 72 is connected to the first voltage supply line ($V_{L1}$) 59 during this time, and therefore the potential is retained at the first voltage $V_{P1}$ irrespective of whether or not the memory cell (MC2) 75 passes a current.

Here, the signal SSA is set at the high level, and thus the binary data of a high/low state is set to the voltages VSA and VSA__ output from the sense amplifier 80, in accordance with the memory cell MC1.

As explained above, according to the present embodiment, it is possible to adopt a folded bit line system without the use of a dummy cell even if the memory cell (MC1) 74 connected to the bit line (BL) 71 and the memory cell (MC2) 75 connected to the inverted bit line (BL__) 72 are connected to one word line (WL) 73.

As a result, the layout design becomes easy. Also, various noise act in exactly the same way on the bit line (BL) 71 and the inverted bit line (BL__) 72. Therefore, the influence of the noise can be suppressed to the lowest level. Accordingly, it is possible to raise the sensitivity of the sense amplifier 80 and to achieve an enhancement of speed.

Note that, in the present embodiment, the current of the memory cell (MC2) 75 can be completely compensated from the first voltage $V_{P1}$, but the above-described circuit can be constituted so far as {the current of memory cell MC1> (the current of the memory cell MC2—the current compensated from the first voltage $V_{P1}$)} stands while considering variations etc.

Also, the circuit according to the present embodiment can be applied to both NAND type and NOR type of the flash memory.

Figure 5:
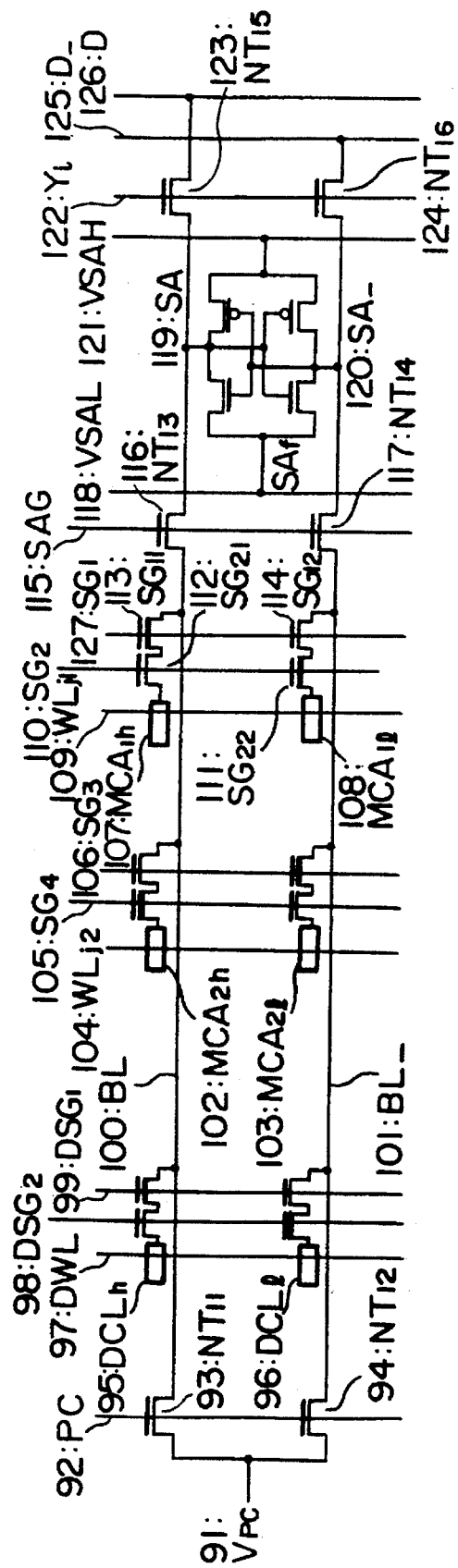
FIG. 5 is a circuit diagram showing a second embodiment of the semiconductor nonvolatile memory device according to the present invention.

FIG. 5 is a circuit diagram showing a second embodiment of the semiconductor nonvolatile memory device according to the present invention. In the present circuit, in a NAND type flash memory, two upper selective transistors are provided, one being made to act as a depletion transistor, whereby it is possible to adopt the folded bit line system. Unlike the first embodiment, a dummy cell is used as a reference cell.

Also, this circuit has the same structure as that of the folded bit line of the well known DRAM circuit except the selective gate of each memory cell array is constituted by two stages.

In FIG. 5, SAf denotes a flip-flop type sense amplifier 119 (in the same way as FIG. 3); BL denotes a bit line 100; BL__denotes an inverted bit line 101; $MCA_{1h}$ and $MCA_{2h}$ denote the memory cell arrays 107 and 102 connected to the bit line (BL) 100; $MCA_{1\lambda}$ and $MCA_{2\lambda}$ are memory cell arrays 108 and 103 connected to the inverted bit line (BL__) 101; $DCL_h$ denotes a dummy cell 95 connected to the bit line (BL) 100; $DCL_\lambda$ denotes a dummy cell 96 connected to the inverted bit line (BL__) 101; D denotes a data line 126; D__ denotes an inverted data line 125 taking a complementary level to that of the data line; and $NT_{11}$ to $NT_{16}$ denote nMOS transistors 93, 94, 116, 117, 123 and 124; respectively.

Figure 6A:
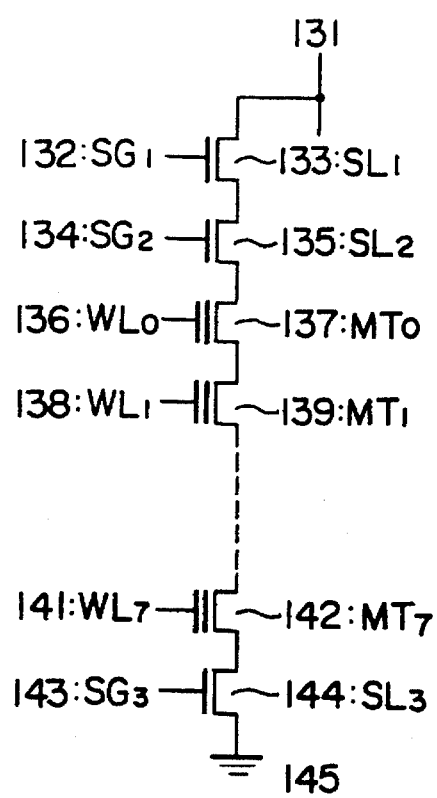
FIGS. 6A and 6B are views showing an example of the structure of a memory cell array of FIG. 5.
Figure 6B:
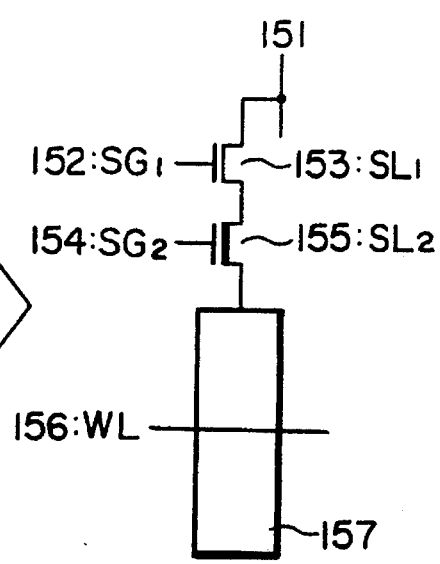

FIG. 6A and 6B are views showing an example of the structure of the memory cell array according to the present embodiment.

As shown in (FIG. 6A), each memory cell array is constituted by upper first and second selective transistors ($SL_1$) 133 and ($SL_2$) 135 connected in series; eight memory transistors ($MT_0$ to $MT_7$) 137, 139, . . . , 142 connected in series to the second selective transistor ($SL_2$) 135; and a lower selective transistor ($SL_3$) 144 connected in series between the memory transistor ($MT_7$) 142 and the ground. One of the first and second selective transistors ($SL_1$) 133 and ($SL_2$) 135 is constituted by a depletion transistor.

In the memory cell array, the first selective transistor ($SL_1$) 133 is connected to the bit line (BL) 100 or the inverted bit line (BL__) 101.

At this time, the first and second selective transistors ($SL_1$) 133 and ($SL_2$) 135 of the memory cell array connected to the same bit line (BL) 100 or inverted bit line (BL__) 101 are alternately constituted by the depletion transistor in an order of connection from the side of the sense amplifier $SA_f$.

This is performed for taking the balance of the capacitance.

Note that, in FIG. 5, the structure of FIG. 6A is expressed by simplifying the same like FIG. 6B.

An explanation will be made next of the operation by the above-described structure taking as an example a case where the data of the memory transistor connected to the selective gates indicated by ($SG_{11}$) 113 and ($SG_{21}$) 112 in FIG. 5 and connected to the word line WLj is read out. Note that, the explanation for the writing/erasing operation is omitted here.

First, as the initial state, the signals PC (92), SAG (115), and Yi (122) are set at the low level (0V). By this, the nMOS transistors ($NT_{11}$ to $NT_{16}$) 93, 94, 116, 117, 123, and 124 become the OFF state.

Further, the signals DSG and SG are set at the low level and the word line WLj and dummy word line (DWL) 97 are set at the high level (5V). Also, the VSAL (118) and VSAH (121) are set at the voltage $V_{pc}$ (91), and the data line (D) 126 and inverted data line (D__) 125 are set at (½) $V_{cc}$ level.

In this state, the signals PC (92) and SAG (115) are set at the high level. By this, the nMOS transistors ($NT_{11}$ to $NT_{14}$) 93, 94, 116, and 117 become the ON state.

As a result, the bit line (BL) 100 and inverted bit line (BL__) 101 are precharged to the voltage $V_{pc}$ (91).

Next, the word line of the almost simultaneously selected cell is set at the low level, and the signal SG is set at the high level.

The signal DSG of the dummy cell DMC connected to the inverted bit line (BL__) 101 is set at the high level and the dummy word line (DWL) 97 is set at the low level.

In this case, the signals $SG_2$ (110) and $DSG_1$ (99) are set at the high level, and the word line (WL) 109 and dummy word line (DWL) 97 are set at the low level.

When the precharge is ended, the signal PC (92) is set at the low level. By this, the nMOS transistors ($NT_{11}$ and $NT_{12}$) 93 and 94 become the OFF state, and the sensing is started.

When the selected cell passes a current, the voltage $V_{BL}$ of the bit line (BL) 100 is lowered. This is not changed if it does not pass a current.

On the other hand, since the dummy cell DMC is set so as to pass a current at an intermediate level, the voltage $V_{BL\_}$ of the inverted bit line (BL__) 101 is slightly lowered.

Namely, when assuming that the selected cell passes a current, the voltage $V_{BL}$ of the bit line (BL) 100 is considerably lowered.

When the potential difference between the bit line (BL) 100 and the inverted bit line (BL__) 101 becomes around −0.1V, the signals SAG (115) and VSAL (118) are set to the low level and VSAH (121) is set to the high level.

By this, looking the outputs SA and SA__ of the sense amplifier $SA_f$, the voltage SA becomes the low level (0V) and the voltage SA__ becomes the high level (5V) due to the operation of the flipflop-type sense amplifier $SA_f$.

Next, the signal Yi (122) is set to the high level. By this, the nMOS transistors ($NT_{15}$ and $NT_{16}$) 123 and 124 become the ON state and the voltages SA and SA__ are read out to the data line (D) 126 and the inverted data line (D__) 125.

As explained above, according to the present embodiment, two selective transistors are used in each memory cell array and one selective transistor is made a depletion transistor, so it is possible to adopt a folded bit line system even in a NAND type flash memory.

As a result, the layout is easy to set. Also, various noise act in exactly the same way on the bit line (BL) 100 and the inverted bit line (BL__) 101. Therefore, the influence of the noise can be suppressed to the lowest level. Accordingly, it is possible to raise the sensitivity of the sense amplifier and to achieve an enhancement of speed.

Further, the cell size can be made smaller than a NOR type and the manufacturing process becomes simple as well.

Also, with a 3V single power source, it is possible to make the cell about 100 ns.

Note that in the second embodiment, NAND type flash memory was explained as an example, but the present invention may also be applied to NOR type flash memory.

As explained above, according to this embodiment, it is possible to adopt a folded bit line system even in a flash memory or other semiconductor nonvolatile memory device.

As a result, the layout becomes easy and, further, various noise act in exactly the same way on the first and second bit lines, so the influence of noise can be suppressed to the lowest level. Accordingly, the sensitivity of the sense amplifier can be raised, and the enhancement of speed can be achieved.

What is claimed is:

1. A semiconductor nonvolatile memory device which adopts a differential type sensing system comprising first and second bit lines connected in parallel with respect to a sense amplifier, comprising:

a first memory cell which is connected to a word line and a first bit line;

a second memory cell which is connected to a word line common with said first memory cell and, connected to said second bit line; and a means for holding the potential of either bit line of said first and second bit lines at a first potential at the time of a reading operation, and, setting the potential of the other bit line at a second potential made to have a difference from said first potential for a predetermined time during said reading operation.

2. A semiconductor nonvolatile memory device as set forth in claim 1, wherein each said memory cell is formed as an NOR type.

3. A semiconductor nonvolatile memory device as set forth in claim 1, wherein each said memory cell is formed as a NAND type.

4. A semiconductor nonvolatile memory device which adopts a differential type sensing system comprising first and second bit lines connected in parallel with respect to a sense amplifier, comprising:

a plurality of memory cell blocks connected to said first and second bit lines, and between each of said respective memory cell blocks and bit lines is located a selective gate having two selective transistors connected in cascade to selectively connect a related memory cell block and bit line.

5. A semiconductor nonvolatile memory device as set forth in claim 4, wherein one of said two selective transistors at said selective gate is constituted by a depletion type transistor.

6. A semiconductor nonvolatile memory device as set forth in claim 5, wherein each said memory cell is formed as an NOR type.

7. A semiconductor nonvolatile memory device as set forth in claim 5, wherein each said memory cell is formed as a NAND type.

* * * * *